United States Patent [19]
Mita

[11] Patent Number: 5,418,396
[45] Date of Patent: May 23, 1995

[54] OPTICAL SEMICONDUCTOR DEVICE AND FABRICATION METHOD THEREFOR

[75] Inventor: Keiji Mita, Osaka, Japan

[73] Assignee: Sanyo Electric Co., Ltd., Osaka, Japan

[21] Appl. No.: 83,409

[22] Filed: Jun. 25, 1993

[30] Foreign Application Priority Data

Jun. 25, 1992 [JP] Japan .................................. 4-167545

[51] Int. Cl.6 ............................................. H01L 33/00
[52] U.S. Cl. ..................................... 257/461; 257/446; 257/464
[58] Field of Search ......................... 257/461, 446, 464

[56]     References Cited
       U.S. PATENT DOCUMENTS 5,101,253  3/1992  Mizutani ............................ 257/461

FOREIGN PATENT DOCUMENTS

54-6794   1/1979  Japan ................................. 257/461
56-61160  5/1981  Japan ................................. 257/461
1255581   1/1989  Japan ................................. 257/461
2238664   9/1990  Japan ................................. 257/446
2246168  10/1990  Japan ................................. 257/461
4114469   4/1992  Japan ................................. 257/461
4152670   5/1992  Japan ................................. 257/461

Primary Examiner—Ngân V. Ngô
Assistant Examiner—Stephen D. Meier
Attorney, Agent, or Firm—Christopher R. Pastel; Thomas R. Morrison

[57]        ABSTRACT

An optical semiconductor includes a photo diode integrated with a transistor built on first and second epitaxial layers grown of intrinsic material on a lightly doped substrate. A separating area divides the optical semiconductor into first and second isolated islands. The separating area is made up of a three separating areas, united end to end to form a single separating area. The first separating area is diffused at least upward from an interface between the substrate and the first epitaxial area. The second separating area is diffused both downward and upward from an interface between the first and second epitaxial layers. The third separating area is diffused downward from the surface of the second epitaxial layer into the substrate. The photo diode is formed in the first island area, and the transistor is formed in the second island area. An offsetting layer in the surface of the substrate, at least below the first island, is counterdoped to expand the depth of the depletion layer of the photo diode. The separating area extends into the substrate to a depth exceeding to the depth of the counterdoped region.

17 Claims, 6 Drawing Sheets

OPTICAL SEMICONDUCTOR DEVICE AND FABRICATION METHOD THEREFOR

BACKGROUND OF THE INVENTION

This invention relates to integrated circuits and, more specifically, to an optical semiconductor device having, integrally formed therein, a photo diode and a bipolar transistor.

Figure 11:
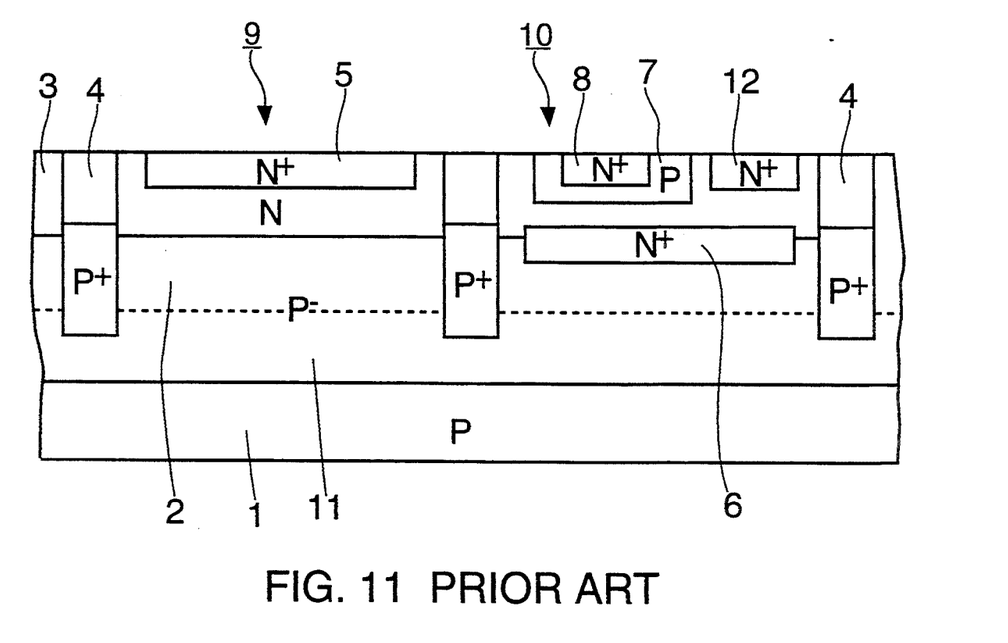
FIG. 11 is a cross section of an optical semiconductor device according to the prior art.

A conventional optical semiconductor device is disclosed in, for example, Japanese Laid-open Patent Publication No. 1-205564. With reference to FIG. 11, P-type semiconductor substrate 1 has epitaxially grown thereon a P-type epitaxial layer 2. An N-type epitaxial layer 3 is epitaxially grown on P-type epitaxial layer 2. A plurality of P+-type separating areas 4 separate N-type epitaxial layer 3, and contiguous upper portions of P-type epitaxial layer 2 into isolated islands. A first island forms a photo diode 9. A second island forms an NPN transistor 10.

Photo diode 9 includes an N+-type diffusion area 5 in its upper surface. An N+-type buried layer 6 spans a substantial part of the interface between epitaxial layers 2 and 3 in the island forming NPN transistor 10. The portion of N-type epitaxial layer 3 in NPN transistor 10 functions as the collector thereof. A P-type base area 7 is disposed in an upper surface of NPN transistor 10. An N+-type emitter area 8 is disposed in an upper surface of P-type base area 7. An N+-type collector contact area 12 is disposed in an upper surface of NPN transistor 10 outside P-type base area 7.

Photo diode 9 is biased to form a PN junction between P-type epitaxial layer 2 and N-type epitaxial layer 3. N+-type diffusion area 5 serves as a cathode of photo diode 9. P+-type separating area 4 serves as an anode of photo diode 9.

An accelerated electric field is formed in NPN transistor 10 by an auto-doped layer 11 in P-type epitaxial layer 2 which becomes autodoped by diffusion of P-type carriers from substrate 1 during epitaxial growth and heat treatment. Auto-doped layer 11 retards the movement of carriers originating below the depletion region.

To obtain a high speed response of photo diode 9, the depletion region is widened to restrain the movement of carriers occurring outside the depletion region. In the structure of the prior-art device in FIG. 11, auto-doped layer 11 overlaps P-type epitaxial layer 2. This overlap results in an increased concentration of impurities and an enlargement of the depletion region.

Epitaxial growth requires processing in a closed vessel into which gasses are fed to grow the desired layers, and to introduce the desired amount of impurities. During growth of P-type epitaxial layer 2, the closed vessel becomes contaminated with the P-type impurities. If an attempt is made to grow N-type epitaxial layer 3 in the same closed vessel used to grow P-type epitaxial layer 2, the P-type contaminants in the vessel enter N-type epitaxial layer 3 in such amounts that it is difficult or impossible to attain the desired properties in N-type epitaxial layer 3.

As a consequence of the contamination of the vessel by P-type impurities during epitaxial growth of P-type epitaxial layer 2, the device must be removed physically from the vessel after P-type epitaxial layer 2 is formed, and placed in a clean vessel for growth of N-type epitaxial layer 3. The requirement for removing and reinstalling the workpiece during processing interferes with production since the same epitaxial growing device cannot be used for all steps to produce the prior-art device.

OBJECTS AND SUMMARY OF THE INVENTION

Accordingly, it is an object of the present invention to provide an integrated photo diode and a transistor which overcomes the drawbacks of the prior art.

It is a further object of the invention to provide an integrated photo diode and a transistor in which epitaxial layers can be formed in the same vessel without requiring removal between the growing of layers.

It is a still further object of the invention to provide an integrated circuit having a photo diode and a transistor in which the photo diode cathode and the transistor emitter are formed of the same material in the same process steps.

It is another object of the invention to provide an integrated circuit having a photo diode and a transistor in which the activation of the photo diode is speeded up by the presence of a depletion layer.

Briefly stated, the present invention provides an optical semiconductor including a photo diode integrated with a transistor built on first and second epitaxial layers grown of intrinsic material on a lightly doped substrate. A separating area divides the optical semiconductor into first and second isolated islands. The separating area is made up of a three separating areas, united end to end to form a single separating area. The first separating area is diffused at least upward from an interface between the substrate and the first epitaxial area. The second separating area is diffused both downward and upward from an interface between the first and second epitaxial layers. The third separating area is diffused downward from the surface of the second epitaxial layer. The photo diode is formed in the first island area, and the transistor is formed in the second island area. An offsetting layer in the surface of the substrate, at least below the first island, is counterdoped to expand the depth of the depletion layer of the photo diode. The separating area extends into the substrate to a depth exceeding to the depth of the counterdoped region.

According to an embodiment of the invention, there is provided an optical semiconductor device comprising: a semiconductor substrate of a first conductivity type, a first epitaxial layer of the first conductivity type epitaxially grown on a surface of the semiconductor substrate, a second epitaxial layer of the first conductivity type epitaxially grown on a surface of the first epitaxial layer, a separating area of the first conductivity type dividing the first and second epitaxial layers into at least first and second island areas, a diffusion area of the second conductivity type in a surface of the second epitaxial layer of the first island area, a depletion layer formed between the diffusion layer and the second epitaxial layer, a buried layer of the second conductivity type at an interface between the first and second epitaxial layers in the second island area, a collector layer of the second conductivity type in the second island area extending from a surface of the second epitaxial layer to the buried layer, the collector layer being inverted from the first conductivity type of the second island area to the second conductivity type, a base area of the first conductivity type in a surface of the collector layer in the second island area, and an emitter area of the second conductivity type in a surface of the base area.

According to a feature of the invention, there is provided an optical semiconductor device comprising: a semiconductor substrate of a first conductivity type, a first epitaxial layer epitaxially grown of intrinsic semiconductor material on a-surface of the semiconductor substrate, a second epitaxial layer epitaxially grown of intrinsic semiconductor material on a surface of the first epitaxial layer, a separating area of the first conductivity type dividing the first and second epitaxial layers into at least first and second island areas, a diffusion area of the second conductivity type in a surface of the second epitaxial layer of the first island area, a buried layer of the second conductivity type at an interface between the first and second epitaxial layers in the second island area, a collector layer of the second conductivity type in the second island area extending from a surface of the second epitaxial layer to the buried layer, the collector layer being inverted from the first conductivity type of the second island area to the second conductivity type, a base area of the first conductivity type in an surface of the collector layer in the second island area, and an emitter area of the second conductivity type in surface of the base area.

According to a further feature of the invention, there is provided an optical semiconductor device comprising: a semiconductor substrate of a first conductivity type, a first epitaxial layer of the first conductivity type epitaxially grown on a surface of the semiconductor substrate, a second epitaxial layer of the first conductivity type epitaxially grown on a surface of the first epitaxial layer, a separating area of the first conductivity type dividing the first and second epitaxial layers into at least first and second island areas, an offsetting layer in a surface of the semiconductor substrate at least below the first island area, the offsetting layer having impurities of the second conductivity type, a diffusion area of the second conductivity type in a surface of the second epitaxial layer of the first island area, a buried layer of the second conductivity type at an interface between the first and second epitaxial layers in the second island area, a collector layer of the second conductivity type in the second island area extending from surface of the second epitaxial layer to the buried layer, the collector layer being inverted from the first conductivity type of the second island area to the second conductivity type, a base area of the first conductivity type in a surface of the collector layer in the second island area, and an emitter area of the second conductivity type in a surface of the base area.

According to a still further feature of the invention, there is provided an optical semiconductor device comprising: a semiconductor substrate of a first conductivity type, a first epitaxial layer epitaxially grown of intrinsic semiconductor material on a surface of the semiconductor substrate, a second epitaxial layer epitaxially grown of intrinsic semiconductor material on a surface of the first epitaxial layer, a separating area of the first conductivity type dividing the first and second epitaxial layers into at least first and second island areas, an offsetting layer containing impurities of the second conductivity type in a surface of the semiconductor substrate at least below the first island for offsetting a concentration of impurities in the semiconductor substrate, a diffusion area of the second conductivity type in a surface of the second epitaxial layer of the first island area, a buried layer of the second conductivity type at an interface between the first and second epitaxial layers in the second island area, a collector layer of the second conductivity type in the second island area extending from a surface of the second epitaxial layer to the buried layer, the collector layer being inverted from the first conductivity type of the second island area to the second conductivity type, a base area of the first conductivity type in a surface of the collector layer in the second island area, and an emitter area of the second conductivity type in surface of the base area.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
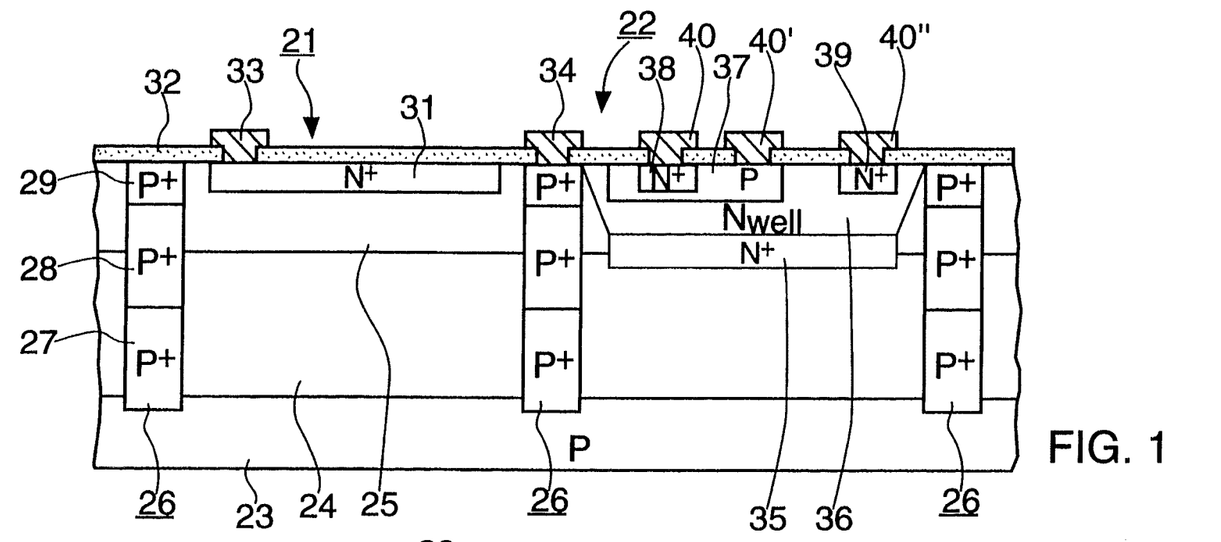
FIG. 1 is a cross section of an optical semiconductor device according to an embodiment of the present invention.

Referring to FIG. 1, a photo diode 21 and an NPN transistor 22 are integrated into a single device. A P-type single crystal silicon semiconductor substrate 23 has a lower concentration of impurities than is normally used in an ordinary bipolar integrated circuit, hereinafter IC, resulting in a resistivity of 40 to 60 ohm.cm. A conventional IC has a resistivity of about 2–4 ohm.cm in its semiconductor substrate. A first epitaxial layer 24 is epitaxially grown by vapor deposition on substrate 23 to a thickness of 15–20 microns.

A second epitaxial layer 25 is also grown by vapor deposition on first epitaxial layer 24 to a thickness of 4–6 microns.

The resistivity of first epitaxial layer 24 is initially from 1000 to 1500 ohm.cm at the time of growth, but changes to 200 to 1500 ohm.cm. due to diffusion of impurities thereinto during subsequent heat treatment. First epitaxial layer 24 forms a central diffusion area. A resistivity of this layer in a conventional IC is 1.0–2.0 ohm.cm.

Portions of first and second epitaxial layers 24 and 25 are electrically isolated from each other by a vertical P+-type separating area 26 into a section for photo diode 21 and a section for NPN transistor 22. P+-type separating area 26 is formed of a first separating area 27, a second separating area 28 and a third separating area 29, overlapping each other, and thereby being electrically connected together (only the left-most separating area 26 is shown with areas 27, 28 and 29 separately identified). First separating area 27 is diffused above and below the interface between substrate 23 and first epitaxial layer 24. Second separating area 28 is diffused above and below the interface between first epitaxial layer 24 and second epitaxial layer 25. Third separating area 29 is diffused downward from a surface of second epitaxial layer 25. Separating areas 27, 28 and 29 overlap to become joined into single separating area 26 that divides epitaxial layers 24 and 25 into isolated island areas.

An N+-type diffusion area 31, which acts as a cathode of photo diode 21, is formed on a portion of the surface of second epitaxial layer 25 of photo diode 21. The surface of second epitaxial layer 25 is covered by an oxidized membrane 32 which is etched to produce a plurality of contact holes, through which an aluminum cathode contact 33 contacts N+-type diffusion area 31. An aluminum anode contact 34 extends through a contact hole in oxidized membrane 32 to contact the upper surface of separating area 26 which serves as a low-resistivity anode for photo diode 21.

An N+-type buried layer 35 spans a substantial part of the interface between first and second epitaxial layers 24 and 25 of NPN transistor 22. An N-type collector layer 36 above N+-type buried layer 35 is doped with phosphorus. N-type collector layer 36 has a resistivity greater than the portion of second epitaxial layer 25 in which it is formed. A P-type base area 37 is formed in the surface of NPN transistor 22. An N+-type emitter area 38 is formed in the surface of P-type base area 37. An N+-type collector contact area 39 of NPN transistor 22 is formed on the surface of NPN transistor 22 outside base area 36.

An aluminum emitter contact 40 passes through oxidized membrane 32 to contact N+-type emitter area 38. An aluminum base contact 40' passes through oxidized membrane 32 to contact base area 37. An aluminum collector contact 40" passes through oxidized membrane 32 to contact N+-type collector contact area 39. Aluminum electrodes 33, 34, 40, 40', and 40" are connected into a circuit (not shown) by conventional aluminum wiring (not shown).

The resulting device includes photo diode 21 capable of functioning as an optical signal input unit integrated with NPN transistor 22 which, together with the other circuit elements, can be used as part of a signal processing circuit.

Figure 2A:
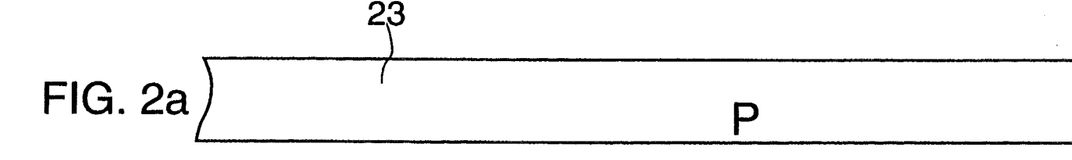
FIGS. 2(A), 2(B), 3(A), 3(B), 4, 5, 6, 7, 8, 9 are cross sections to which reference will be made in describing the steps of the process for producing the optical semiconductor device of FIG. 1.

An IC having the foregoing structure can be produced by the following process:

Referring to FIG. 2(A), P-type silicon semiconductor substrate 23 is doped to a resistivity of 40 to 60 ohm.cm.

Figure 2B:
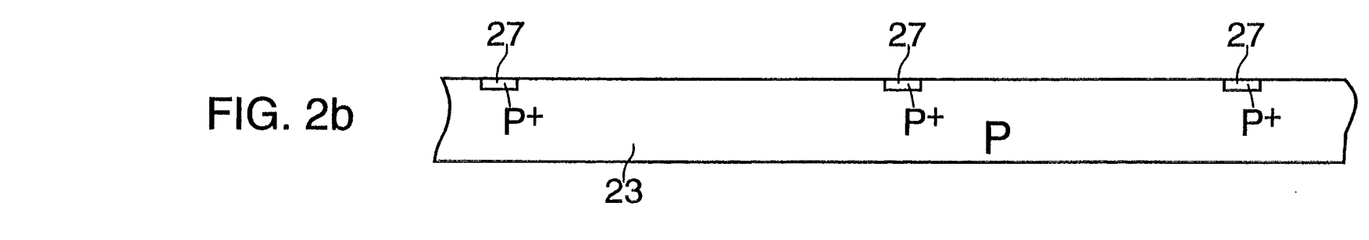

Referring to FIG. 2(B), P-type silicon semiconductor substrate 23 is heated in an oxygen atmosphere to develop an insulating oxide membrane on its upper surface. The oxide membrane is coated with a negative photo resist membrane. The photo resist membrane is baked, exposed and chemically etched to expose a corresponding pattern in the upper surface of substrate 23. Boron is ion-implanted through the pattern to form three spaced-apart first separating areas 27.

Figure 3A:
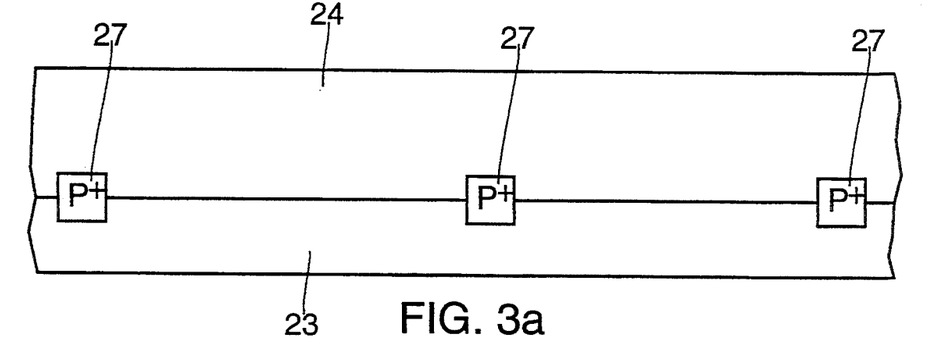

Referring now to FIG. 3(A), the oxide membrane is removed, and substrate 23 is washed. Substrate 23 is then placed in an epitaxial growing device (not shown) and heated by a lamp or a high frequency electromagnetic wave to a temperature of approximately 1,140 C. SiH$_2$Cl$_2$ gas is introduced into a reaction tube, thus growing first epitaxial layer 24 of intrinsic material to a thickness of 15-20 microns. A small amount of autodoping of first epitaxial layer 24 takes place during growth by diffusion of boron P-type impurities from substrate 23, first separating area 27, and the rear side of wafer to yield a first epitaxial layer 24 having a relatively high resistivity of 200-1500 ohm.cm.

Figure 3B:
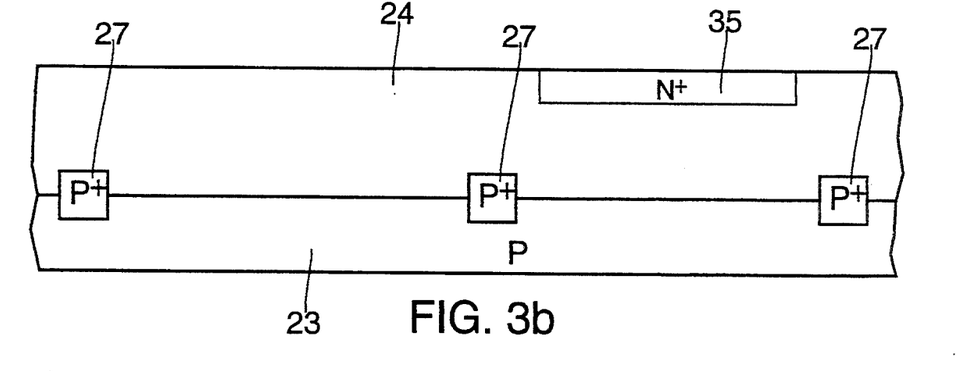

Referring to FIG. 3(B), the apparatus is heated in an oxygen atmosphere to produce an insulating oxide membrane. The oxide membrane is coated with a negative photo resist membrane. The photo resist membrane is baked, exposed and chemically etched to expose a corresponding pattern in the upper surface of first epitaxial layer 24 to diffuse antimony into the surface of first epitaxial layer 24 to produce a precursor of N+-type buried layer 35. At this time, first separating area 27 is also diffused upward and downward.

Figure 4:
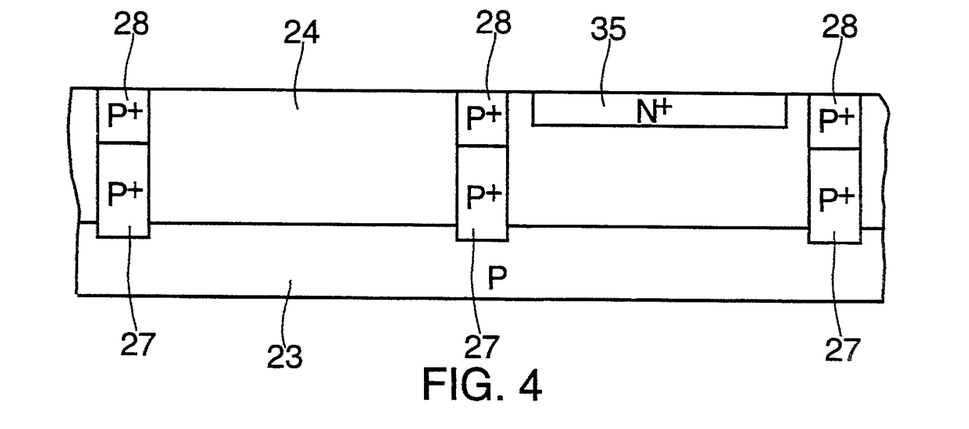

Referring to FIG. 4, a further resist membrane is coated over oxide membrane, dried, exposed and etched to produce a selective mask, thereby exposing portions of the surface of first epitaxial layer 24. Boron is ion-implanted to form a precursor of three second separating areas 28 of separating area 26. The resist membrane is removed, and the device is heat treated to diffuse second separating areas 28 from 6 to 8 microns downward and to diffuse first separating area 27 from 8 to 10 microns upward until they overlap to become a single entity.

Figure 5:
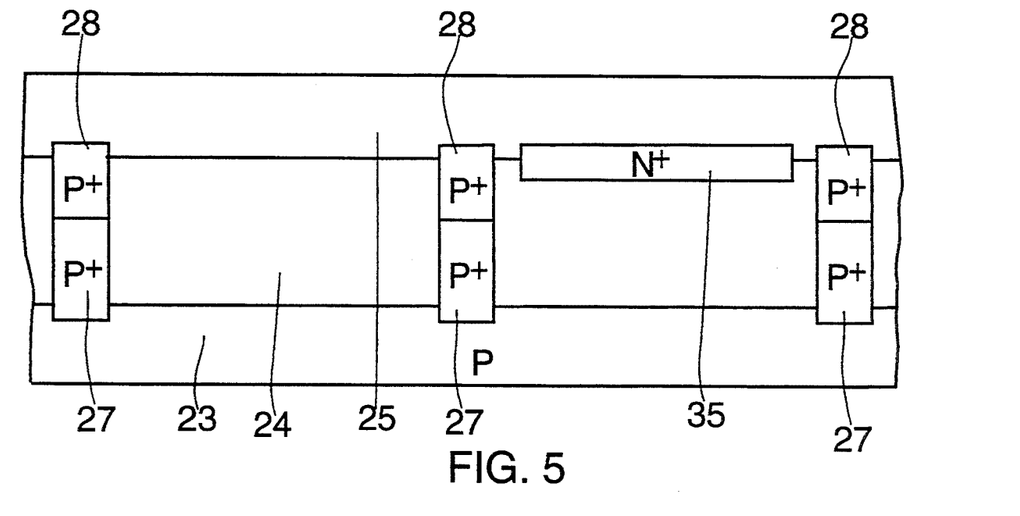

Referring to FIG. 5, oxide layer is removed, and second epitaxial layer 25 is epitaxially grown to a thickness of 4 to 6 microns atop the surface of first epitaxial layer 24. During this process step, second separating areas 28, and N+-type buried layer 35 diffuse upward partway into newly-applied second epitaxial layer 25.

Figure 6:
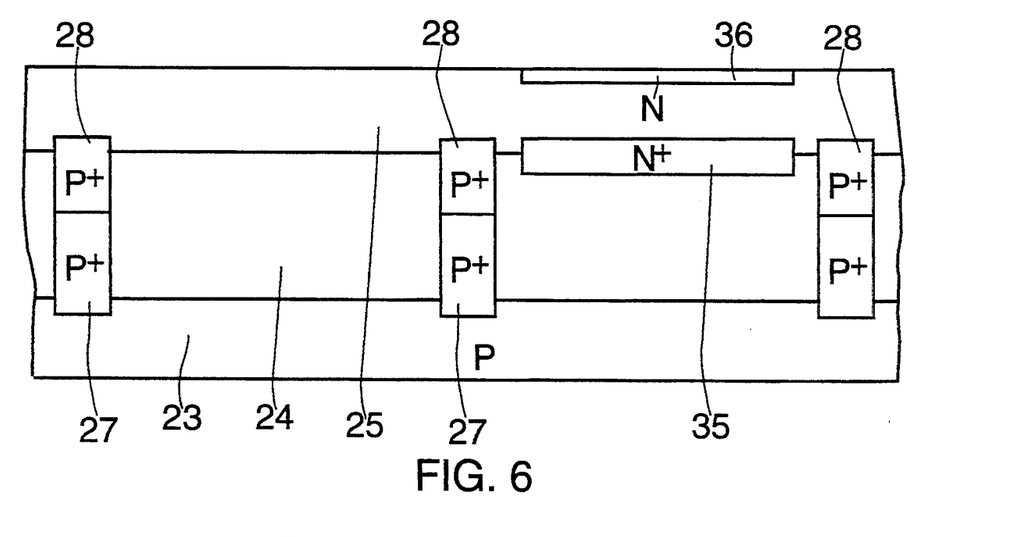

Referring to FIG. 6, the device is heated in an oxygen containing atmosphere to produce a further oxide membrane on the surface of second epitaxial layer 25. The oxide membrane is coated with a negative photo resist membrane. The photo resist membrane is baked, exposed and chemically etched to expose a corresponding pattern in the upper surface of second epitaxial layer 25. Phosphorus is ion-implanted through the resist pattern to a concentration of $10^{12}$ atoms per cm$^2$ at about 80 KeV to form a precursor of N-type collector layer 36.

Figure 7:
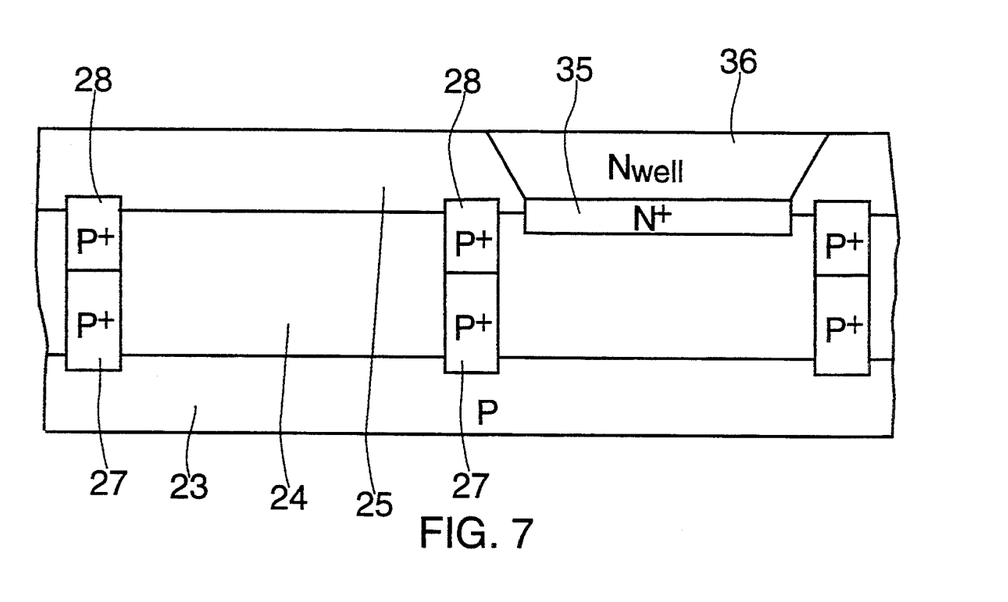

Referring to FIG. 7, the device is heat treated at about 1100°–1200° C. for 2 to 3 hours to diffuse the phosphorus forming N-type collector layer 36 about 3 to 5 microns downward and N+-type buried layer 35 diffuses upward until these two layer are joined. First separating area 27 and second separating area 28 are also diffused upward and downward during this heat treatment.

Figure 8:
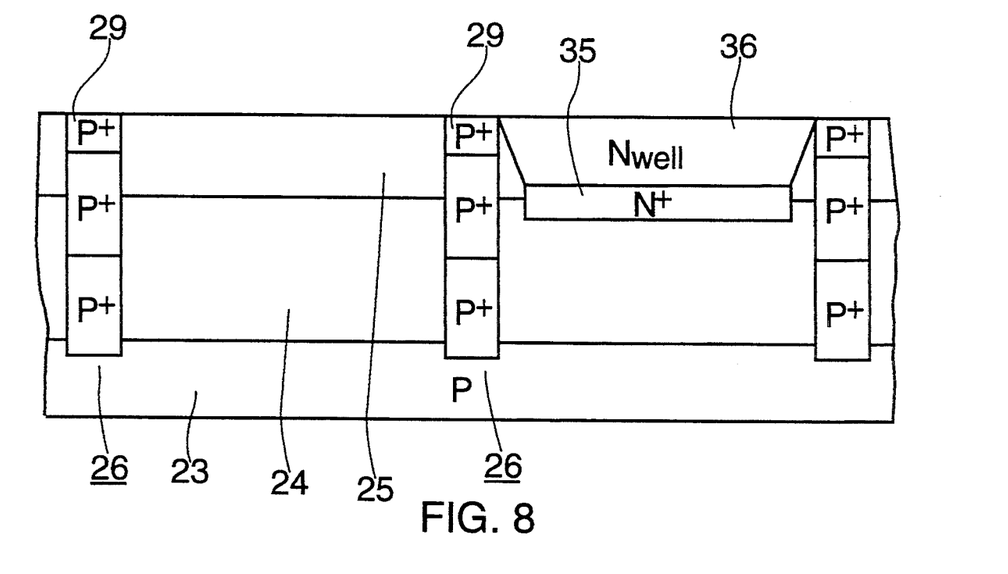

Referring to FIG. 8, the device is heated in an oxygen atmosphere to produce an insulating oxide membrane, thus coated with a negative photo resist membrane. The photo resist membrane is baked, exposed and chemically etched to expose a corresponding pattern in the upper surface of second epitaxial layer 25. Boron is ion-implanted through the pattern to form precursors of third separating areas 29. Further heat treatment diffuses the boron downward to a thickness of 2-3 microns to form third separating areas 29, and also diffuses second separating areas 28 upward until these areas join. At this point, the three separating areas 27, 28 and 29 overlap to form single separating areas 26 that divide epitaxial layers 24 and 25 into isolated island areas.

Figure 9:
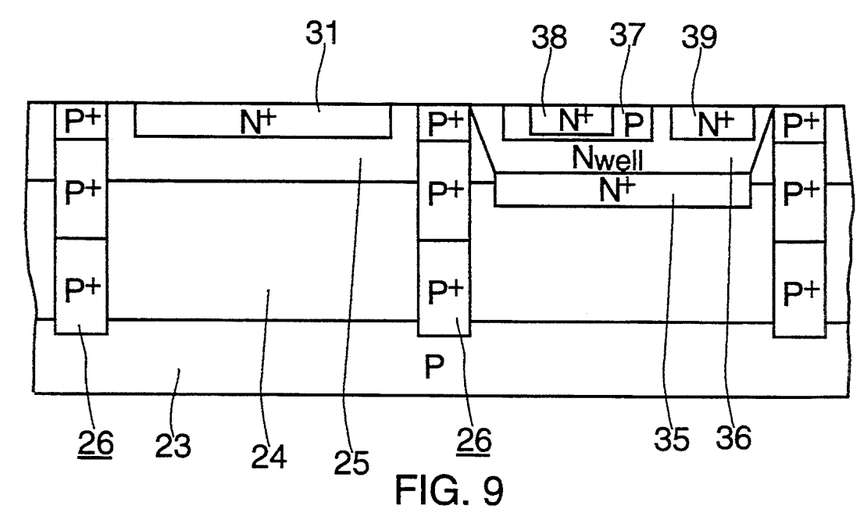

Referring to FIG. 9, a resist pattern is processed to form a mask for the implantation of boron to produce P-type base area 37. Next, phosphorus diffuses to produce N+-type diffusion area 31, N+-type emitter area 38 and N+-type collector contact area 39 in the surface of the device.

Returning now to FIG. 1, aluminum electrodes 33, 34, 40, 40', and 40" pass through openings in oxidized membrane 32 to provide external contact to N+-type diffusion area 31, the center P+ type separating area 26, N+-type emitter area 38, P-type base area 37 and N+-type collector contact area 39, respectively.

Photo diode 21 of the IC having the foregoing structure has the following features:

Cathode contact 33 and anode contact 34 are reverse biased at Vcc (+5 V) and GND, respectively. This bias produces a depletion layer extending from the interface between P-type second epitaxial layer 25 and N+-type diffusion area 31 into epitaxial layers 24 and 25. Epitaxial layers 24 and 25 have high resistivity.

A light with a frequency of 800 nm passes into photo diode 21 to a depth of more than 20 microns. The light generates carriers inside photo diode 21 to produce a photocurrent therein.

The carriers are generated inside the depletion layer and a corresponding number of carriers are generated outside depletion layer. The carriers inside the depletion layer move very quickly because of the low resistivity in this region. The carriers outside the depletion layer move slowly because of the higher resistivity in this region.

In this invention, since the depletion layer extends almost completely through both epitaxial layers 24 and 25, almost all of the carriers are generated within the depletion layer so that the response of photo diode 21 is very fast.

Moreover, N+-type diffusion area 31, forming the emitter of photo diode 21, is very thin, being limited in depth to from about 0.3 to 1.0 microns. Such a thin emitter is not capable of generating a large number of carriers. Because of the high concentration of impurities in first and second epitaxial layers 24 and 25, the carriers generated therein disappear quickly or move rapidly into N+-type diffusion area 31. As a result, little delay current is produced by carrier diffusion.

The deep diffusion area formed by the center P+-type separating area 26 provides a very low-resistance anode electrode.

NPN transistor 22 of the IC having the foregoing structure has the following features:

The concentration of impurities in N-type collector layer 36 of second epitaxial layer 25 is suitable to provide transistor action.

The heat treated period required to diffuse N-type collector area 36 downward into contact with N+-type buried layer 35 is limited because of the two epitaxial layers. Only a portion of second epitaxial layer 25 must be converted to an N-type area.

Epitaxial layers 24 and 25 are very lightly P-doped, whereby they have relatively high resistivity. The P doping of epitaxial layers 24 and 25 is so light that a processing vessel can be used for subsequent N-type epitaxial growth without pollution of the vessel by the P-type impurities of epitaxial layers 24 and 25. Also, the light P doping permits easy control of resistivity.

The prior art device of FIG. 11 has the problem that boron diffuses upward during heat treatment from the heavily P-doped substrate 1 to the epitaxial layer 2 above it, so as to produce auto-doped layer 11. Auto-doped layer 11 prevents the extension of depletion layer to substrate 1.

Referring again to FIG. 1, the low P doping of substrate 23, to about 40 to 60 ohm.cm, and the even lower doping of first epitaxial layer 24, to about 1000 to 1500 ohm.cm (with a final resistivity of 200 to 1500 ohm.cm) decreases the problem of an autodoped layer extending into first epitaxial layer 24. The very low P doping of substrate 23, and the relatively low P doping of first epitaxial layer reduces the autodoping layer and permits the depletion layer to extend substantially the entire distance to the surface of substrate 23.

The high resistivity of substrate 23 and the decrease in the autodoped layer would cause the resistance at anode contact 34 to increase if the design of the prior art in FIG. 11 were used. However, in the embodiment of the present invention in FIG. 1, the increase in resistance at anode contact 34 is prevented by extending P+-type separating area 26 all the way down into substrate 23.

Figure 10:
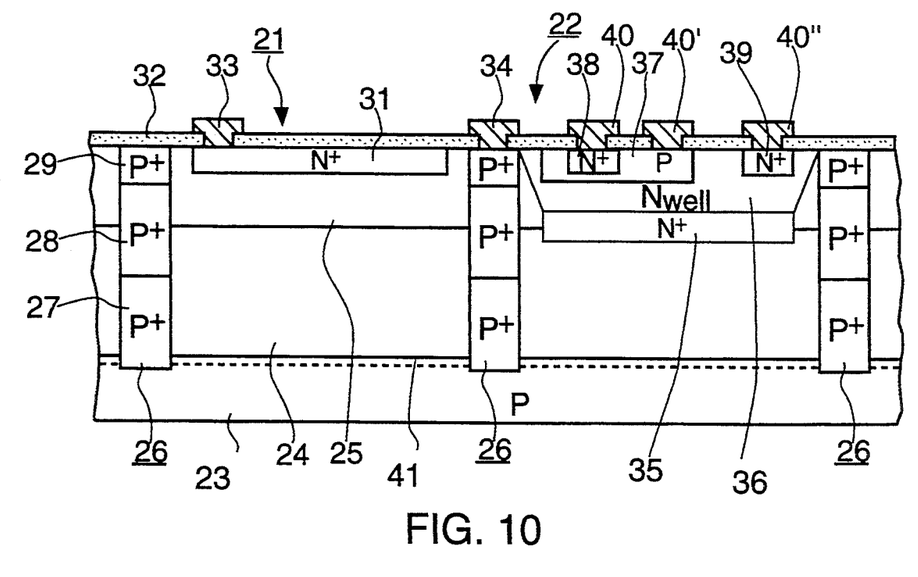
FIG. 10 is a cross section of an optical semiconductor according to a further embodiment of the present invention.

Referring now to FIG. 10, a second embodiment of the invention includes an offsetting layer 41 of N-type impurities ion-implanted into the surface of substrate 23 of photo diode 21 to offset the concentration of impurities in the surface of substrate 23. Offsetting layer 41 permits the depletion layer to extend all the way to the surface of substrate 23. The N-type impurities forming offsetting layer 41 may be ion-implanted into substrate 23 only below the island forming photo diode 21. However, for processing simplicity, it is acceptable for the N-type impurities to be implanted over the entire surface of substrate 23, including below islands for both photo diode 21 and NPN transistor 22. The diffusion of N-type impurities does not exceed the depth to which first separating area 27 extends. Thus, the inclusion of offsetting layer 41 does not increase the resistance at anode electrode 34.

Phosphorus is ion-implanted to a concentration of 1 to $5 \times 10^{11}$ atoms per cm$^2$ to form the precursor of offsetting layer 41. After implantation, the phosphorus is diffused by heat treatment to yield a resistivity varying from 40–60 ohm.cm to more than 200 ohm.cm. Offsetting layer 41 is diffused to a depth of 2–10 microns. First separating area 27 extends downward to a depth of 7 to 15 microns in substrate 23. Separating area 27 extends below offsetting layer 41, and thus blocks sideways migration of carriers from offsetting layer 41. The N-type impurities in offsetting layer 41 diffuse upward into the neighboring region of first epitaxial layer 24 where they offset P-type carriers auto-doped upward into first epitaxial layer 24 from substrate 23.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An optical semiconductor device comprising:
   a semiconductor substrate of a first conductivity type;
   a first epitaxial layer of said first conductivity type epitaxially grown on a surface of said semiconductor substrate;
   a second epitaxial layer of said first conductivity type epitaxially grown on a surface of said semiconductor substrate;
   said first and second epitaxial layers have a resistivity of more than 200 ohm.cm;
   a separating area of said first conductivity type dividing said first and second epitaxial layers into at least first and second island areas;
   a diffusion area of said first conductivity type in a surface of said second epitaxial layer of said second island area;
   a depletion layer formed in said first island area between said diffusion layer and said second epitaxial layer;

said semiconductor substrate having impurities such that said depletion layer extends at least to said surface of said semiconductor substrate when said diffusion area and said separating area are reverse biased at about 5 volts potential differences;

a buried layer of said second conductivity type at an interface between said first and second epitaxial layers in said second island area;

a collector layer of said second conductivity type in said second island area extending from a surface of said second epitaxial layer to said buried layer;

said collector layer being inverted from said first conductivity type of said second island area to said second conductivity type;

a base area of said first conductivity type in a surface of said collector layer in said second island area; and an emitter area of said second conductivity type in a surface of said base area.

2. An optical semiconductor device according to claim 1 in which said separating area includes a first separating area, a second separating area and a third separating area, all congruent and joined together;

said first separating area being diffused upward from a surface of said substrate;

said third separating area being diffused downward from a surface of said second epitaxial layer;

said second separating area being centered in an interface between said first and epitaxial layers, and being diffused downward to connect to said first separating area, and being diffused upward to connect to said third separating area.

3. An optical semiconductor device according to claim 1 in which said semiconductor substrate has a resistivity of 40 to 60 ohm.cm.

4. An optical semiconductor device according to claim 1 in which said diffusion area and said emitter area are formed during the same process steps.

5. An optical semiconductor device according to claim 1, wherein said separating area extends into said semiconductor substrate.

6. An optical semiconductor device comprising:
a semiconductor substrate of a first conductivity type;
a first epitaxial layer epitaxially grown of intrinsic semiconductor material on a surface of said semiconductor substrate;
a second epitaxial layer epitaxially grown of intrinsic semiconductor material on a surface of said first epitaxial layer;
a separating area of said first conductivity type dividing said first and second epitaxial layers into at least first and second island areas;
a diffusion area of a second conductivity type in a surface of said second epitaxial layer of said first island area;
a depletion layer formed in said first island area between said diffusion layer and said second epitaxial layer such that said depletion layer extends at least to said surface of said semiconductor substrate when said diffusion area and said separating area are reverse biased at about 5 volts potential difference;
a buried layer of said second conductivity type at an interface between said first and second epitaxial layers in said second island area;
a collector layer of said second conductivity type in said second island area extending from a surface of said second epitaxial layer to said buried layer;

said collector layer being inverted from said first conductivity type of said second island area to said second conductivity type;
a base area of said first conductivity type in a surface of said collector layer in said second island area; and
an emitter area of said second conductivity type in a surface of said base area.

7. An optical semiconductor device according to claim 6 in which said semiconductor substrate has a resistivity of 40 to 60 ohm.cm.

8. An optical semiconductor device according to claim 6 in which said diffusion area and said emitter area are formed during the same process steps.

9. An optical semiconductor device according to claim 6, wherein said separating area extends into said semiconductor substrate.

10. An optical semiconductor device comprising;
a semiconductor substrate of a first conductivity type;
a first epitaxial layer of said first conductivity type epitaxially grown on a surface of said semiconductor substrate;
a second epitaxial layer of said first conductivity type epitaxially grown on a surface of said first epitaxial layer;
said first and second epitaxial layers have resistivities of more than 200 ohm.cm;
a separating area of said first conductivity type dividing said first and second epitaxial layers into at least first and second island areas;
an offsetting layer in a surface of said semiconductor substrate at least below said first island area;
said offsetting layer having impurities of said second conductivity type so that said offsetting layer has a resistivity of greater than 60 ohm.cm;
a diffusion area of said first conductivity type in a surface of said second epitaxial layer of said first island area;
a buried layer of said second conductivity type at an interface between said first and second epitaxial layers in said second island area;
a collector layer of said second conductivity type in said second island area extending from said surface of said second epitaxial layer to said buried layer;
said collector layer being inverted from said first conductivity type of said second island area to said second conductivity type;
a base area of said first conductivity type in a surface of said collector layer in said second island area; and
an emitter area of said second conductivity type in a surface of said base area.

11. An optical semiconductor device according to claim 10 in which said semiconductor substrate has a resistivity of 40 to 60 ohm.cm.

12. An optical semiconductor device according to claim 10 in which said diffusion area and said emitter area are formed during the same process steps.

13. An optical semiconductor device according to claim 10, wherein said separating area extends into said semiconductor substrate.

14. An optical semiconductor device comprising:
a semiconductor substrate of a first conductivity type;
a first epitaxial layer epitaxially grown of intrinsic semiconductor material on a surface of said semiconductor substrate;

a second epitaxial layer epitaxially grown of intrinsic semiconductor material on a surface of said first epitaxial layer;

a separating area of said first conductivity type dividing said first and second epitaxial layers into at least first and second island areas;

an offsetting layer containing impurities of a second conductivity type in a surface of said semiconductor substrate at least below said first island area for offsetting a concentration of impurities in said semiconductor substrate;

said offsetting layer having a resistivity greater than 60 ohm.cm due to ion implantation;

a diffusion area of said second conductivity type in a surface of said second epitaxial layer of said first island area;

a buried layer of said second conductivity type at an interface between said first and second epitaxial layers in said second island area;

a collector layer of said second conductivity type in said second island area extending from a surface of said second epitaxial layer to said buried layer;

said collector layer being inverted from said first conductivity type of said second island area to said second conductivity type;

a base area of said first conductivity type in a surface of said collector layer in said second island area; and an emitter area of said second conductivity type in a surface of said base area.

15. An optical semiconductor device according to claim 14 in which said semiconductor substrate has a resistivity of 40 to 60 ohm.cm.

16. An optical semiconductor device according to claim 14 in which said diffusion area and said emitter area are formed during the same process steps.

17. An optical semiconductor device according to claim 14, wherein said separating area extends into said semiconductor substrate, exceeding a distance that said offsetting layer extends into said semiconductor substrate.

* * * * *